(12) United States Patent
Balteanu et al.

(10) Patent No.: US 9,831,834 B2
(45) Date of Patent: Nov. 28, 2017

(54) ENVELOPE TRACKING WITH LOW FREQUENCY LOSS CORRECTION

(71) Applicant: SKYWORKS SOLUTIONS, INC., Woburn, MA (US)

(72) Inventors: Florinel G. Balteanu, Irvine, CA (US); Jose Alejandro Macedo, Ottawa (CA); Peter Harris Robert Popplewell, Ottawa (CA); Jakub F. Pingot, Ottawa (CA)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 14/803,355

(22) Filed: Jul. 20, 2015

(65) Prior Publication Data

US 2016/0036389 A1 Feb. 4, 2016

Related U.S. Application Data

(60) Provisional application No. 62/030,224, filed on Jul. 29, 2014.

(51) Int. Cl.
*H03F 3/191* (2006.01)
*H03G 3/20* (2006.01)
(Continued)

(52) U.S. Cl.
CPC .......... *H03F 1/0216* (2013.01); *H02M 3/155* (2013.01); *H03F 1/025* (2013.01); *H03F 1/0222* (2013.01); *H03F 1/0227* (2013.01); *H03F 1/0255* (2013.01); *H03F 1/0277* (2013.01); *H03F 3/082* (2013.01); *H03F 3/195* (2013.01); *H03F 3/245* (2013.01); *H03F 3/45071* (2013.01); *H03F 3/68* (2013.01); *H03F 3/72* (2013.01); *H02M 2001/0045* (2013.01); *H03F 2200/102* (2013.01); *H03F 2200/111* (2013.01); *H03F 2200/429* (2013.01); *H03F 2200/504* (2013.01); *H03F 2200/511* (2013.01);
(Continued)

(58) Field of Classification Search
CPC .............. H03F 3/04; H03F 3/191; H03G 3/20
USPC .......................................... 330/13, 297, 302
See application file for complete search history.

(56) References Cited

U.S. PATENT DOCUMENTS 3,927,420 A * 12/1975 Hayashi .................... H03G 5/22
330/126
4,424,416 A * 1/1984 Fukuoka .................... H04S 1/00
181/146
(Continued)

*Primary Examiner* — Patricia T Nguyen
(74) *Attorney, Agent, or Firm* — Chang & Hale LLP

(57) ABSTRACT

A low frequency loss correction circuit that improves the efficiency of a power amplifier at near-DC low frequencies The low frequency loss correction circuit can include a signal error detection circuit configured to produce an error signal in response to detecting one or more frequency components of a tracking signal below a cutoff frequency that are substantially attenuated through a capacitive path. The low frequency loss correction circuit can include a drive circuit configured to convert the error signal into a low frequency correction signal, and provide the low frequency correction signal to a voltage supply line, the low frequency correction signal including at least some of the one or more frequency components of the tracking signal below a cutoff frequency that are substantially attenuated through the capacitive path.

20 Claims, 10 Drawing Sheets

(51) Int. Cl.

| | |
|---|---|
| *H03F 3/04* | (2006.01) |
| *H03F 1/02* | (2006.01) |
| *H03F 3/08* | (2006.01) |
| *H03F 3/195* | (2006.01) |
| *H03F 3/24* | (2006.01) |
| *H03F 3/68* | (2006.01) |
| *H03F 3/72* | (2006.01) |
| *H03F 3/45* | (2006.01) |
| *H02M 3/155* | (2006.01) |
| *H02M 1/00* | (2006.01) |

(52) U.S. Cl.
CPC .... *H03F 2200/555* (2013.01); *H03F 2200/78* (2013.01); *H03F 2203/7209* (2013.01); *H03F 2203/7221* (2013.01); *H03F 2203/7236* (2013.01)

(56) References Cited

U.S. PATENT DOCUMENTS

| | | | | |
|---|---|---|---|---|
| 5,303,266 | A * | 4/1994 | Budin | H04B 3/06 370/906 |
| 5,553,151 | A * | 9/1996 | Goldberg | H03G 7/002 381/312 |
| 6,690,922 | B1 * | 2/2004 | Lindemann | H03G 3/3047 455/522 |
| 2007/0003075 | A1 * | 1/2007 | Cooper | H04S 3/00 381/98 |
| 2009/0003167 | A1 * | 1/2009 | Kobayashi | G11B 7/0906 369/53.12 |
| 2012/0194274 | A1 | 8/2012 | Fowers et al. | |
| 2013/0207731 | A1 | 8/2013 | Balteanu | |
| 2013/0214752 | A1 | 8/2013 | Tournatory | |
| 2015/0097622 | A1 * | 4/2015 | Itabashi | H04B 10/50593 330/254 |
| 2016/0094192 | A1 * | 3/2016 | Khesbak | H04B 1/0475 455/73 |

* cited by examiner

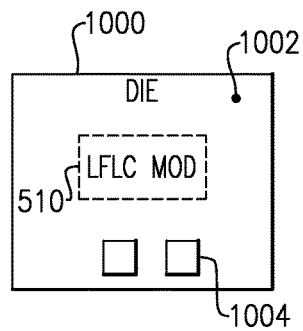 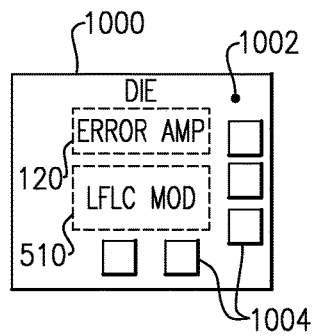 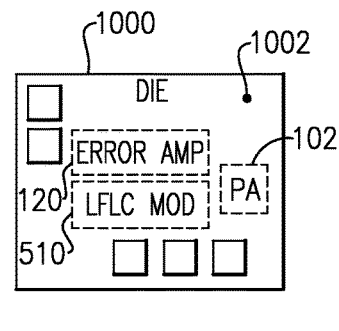
FIG.9A        FIG.9B        FIG.9C
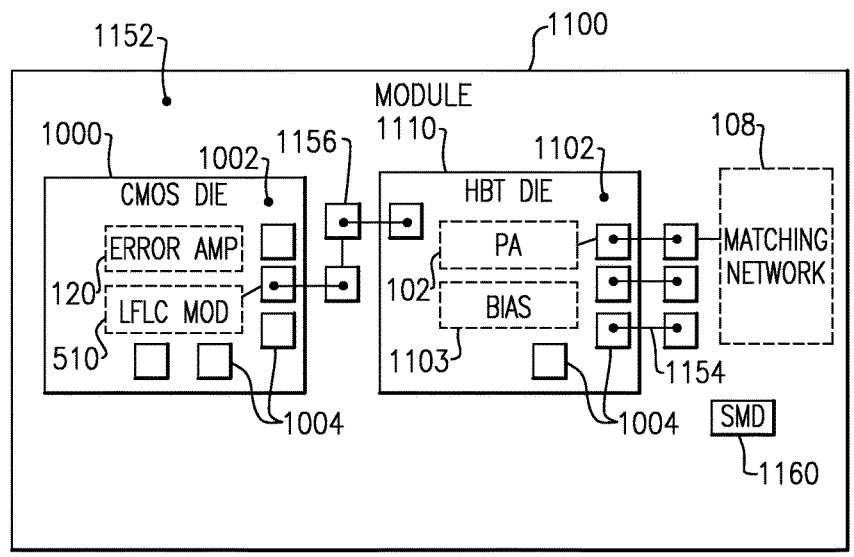
FIG.10

US 9,831,834 B2

ENVELOPE TRACKING WITH LOW FREQUENCY LOSS CORRECTION

CROSS-REFERENCE TO RELATED APPLICATION(S)

This application claims priority to U.S. Provisional Application No. 62/030,224 filed Jul. 29, 2014, entitled ENVELOPE TRACKING WITH LOW FREQUENCY LOSS CORRECTION, the disclosure of which is hereby expressly incorporated by reference herein in its entirety.

BACKGROUND

Field

The present disclosure generally relates to wireless communication systems and, more specifically, to improving the efficiency of power amplifiers therein.

Description of the Related Art

Power amplifiers are widely used in various communication networks to set the transmission power level of an information-bearing signal transmitted by a device. For example, power amplifiers are used to set the pulse energy emitted by pulsed lasers in optical communication networks. Power amplifiers are also used in the radio frequency (RF) front end components of wireless carrier network devices—such as base stations, repeaters, and mobile devices—to set the power level of a signal transmitted through an antenna. Power amplifiers are also used in local area networks to support both wired and wireless connectivity of servers, computers, laptops, and peripheral devices.

Managing the operation of a power amplifier is often of particular interest in mobile devices. The efficiency of a power amplifier is often a leading factor in the efficiency of a RF front end, and in turn, battery life of a mobile device. Envelope tracking can be used to improve power amplifier efficiency. Envelope tracking includes adapting the voltage supply level provided to a power amplifier in relation to the envelope of the RF signal amplified by the power amplifier. In other words, the voltage supply level provided to a power amplifier increases in response to increases of the envelope of the RF signal. Likewise, the voltage supply level decreases in response to decreases of the envelope of the RF signal. Having the voltage supply level track the envelope of the RF signal reduces the peak-to-average voltage drop ratio across the power amplifier, and in turn, reduces the current drawn by the power amplifier. Envelope tracking is particularly useful in reducing the current draw within RF signal troughs, during which current draw by the power amplifier usually peaks.

A coupling capacitor is typically used to isolate the DC voltage level of the envelope tracking circuitry from the DC voltage supply of the power amplifier. However, because of the finite size of the coupling capacitor, near-DC low frequencies are also typically blocked by the coupling capacitor along with the DC voltage level of the envelope tracking circuitry. As a result, the efficiency of a power amplifier at near-DC low frequencies cannot be improved by envelop tracking using known methods and circuit arrangements because of the finite limitations of coupling capacitors.

SUMMARY

In accordance with some implementations, the present disclosure relates to a low frequency loss correction circuit that improves the efficiency of a power amplifier at near-DC low frequencies The low frequency loss correction circuit can include a signal error detection circuit configured to produce an error signal in response to detecting one or more frequency components of a tracking signal below a cutoff frequency that are substantially attenuated through a capacitive path. The low frequency loss correction circuit can include a drive circuit configured to convert the error signal into a low frequency correction signal, and provide the low frequency correction signal to a voltage supply line, the low frequency correction signal including at least some of the one or more frequency components of the tracking signal below a cutoff frequency that are substantially attenuated through the capacitive path.

In some implementations, the signal error detection circuit includes first and second detection nodes connectable across the capacitive path configured to sense respective first and second signals.

In some implementations, the signal error detection circuit includes a comparator configured to produce the error signal as a function of respective first and second signals sensed across the capacitive path.

In some implementations, the drive circuit includes a drive transistor coupled to the voltage supply line.

In some implementations, a terminal of the driver transistor is coupled to a portion of a voltage divider stemming from the voltage supply line.

In some implementations, the drive circuit includes a differential amplifier arranged to produce the low frequency correction signal using the error signal and a reference signal.

In some implementations, the controller can be included in an envelope tracking module configured to provide an envelope signal to a voltage supply of a power amplifier.

In some implementations, the present disclosure relates to power amplifier (PA) module that includes a packaging substrate configured to receive a plurality of components. The PA module further includes power amplifier circuit provided in a die included on the packaging substrate, the power amplifier including a voltage supply line. The PA module further includes a signal error detection circuit configured to produce an error signal in response to detecting one or more frequency components of a tracking signal below a cutoff frequency that are substantially attenuated through a capacitive path coupled to the voltage supply line. The PA module further includes a drive circuit configured to convert the error signal into a low frequency correction signal, and provide the low frequency correction signal to the voltage supply line, the low frequency correction signal including at least some of the one or more frequency components of the tracking signal below a cutoff frequency that are substantially attenuated through the capacitive path.

In some implementations, the PA module can further include a tracking circuit configured to provide the tracking signal, the tracking signal characterizing the voltage envelope of a radio frequency signal amplified by the power amplifier.

In some implementations, the signal error detection circuit includes first and second detection nodes connectable across the capacitive path configured to sense respective first and second signals.

In some implementations, the signal error detection circuit includes a comparator configured to produce the error signal as a function of respective first and second signals sensed across the capacitive path.

In some implementations, the drive circuit includes a drive transistor coupled to the voltage supply line.

In some implementations, a terminal of the drive transistor is coupled to a portion of a voltage divider stemming from the voltage supply line.

In some implementations, the drive circuit includes a differential amplifier arranged to produce the low frequency correction signal using the error signal and a reference signal.

According to some teachings, the present disclosure relates to a wireless device that includes a power amplifier circuit including a voltage supply line. The wireless device further includes a signal error detection circuit configured to produce an error signal in response to detecting one or more frequency components of a tracking signal below a cutoff frequency that are substantially attenuated through a capacitive path coupled to the voltage supply line. The wireless device further includes a drive circuit configured to convert the error signal into a low frequency correction signal, and provide the low frequency correction signal to the voltage supply line, the low frequency correction signal including at least some of the one or more frequency components of the tracking signal below a cutoff frequency that are substantially attenuated through the capacitive path.

In some implementations, the wireless device further includes a tracking circuit configured to provide the tracking signal, the tracking signal characterizing the voltage envelope of a radio frequency signal amplified by the power amplifier.

In some implementations, the signal error detection circuit includes first and second detection nodes connectable across the capacitive path configured to sense respective first and second signals.

In some implementations, the drive circuit includes a drive transistor coupled to the voltage supply line.

In some implementations, a terminal of the drive transistor is coupled to a portion of a voltage divider stemming from the voltage supply line.

In some implementations, the drive circuit includes a differential amplifier arranged to produce the low frequency correction signal using the error signal and a reference signal.

According to some teachings, the present disclosure relates to a method of envelope tracking with low frequency loss correction. The method includes detecting low frequency component loss of an envelope signal through a capacitive path. The method further includes generating an error signal that is representative of low frequency component loss. The method further includes converting the error voltage signal into a loss correction signal. The method further includes adding the loss correction signal to the voltage supply line of a power amplifier.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

FIGS. 9A-9C are schematic diagrams of different integrated circuit implementations of the low frequency loss correction circuit of FIG. 5.

FIG. 10 is a schematic diagram of an implementation of a module including the low frequency loss correction of FIG. 5.

Figure 1:
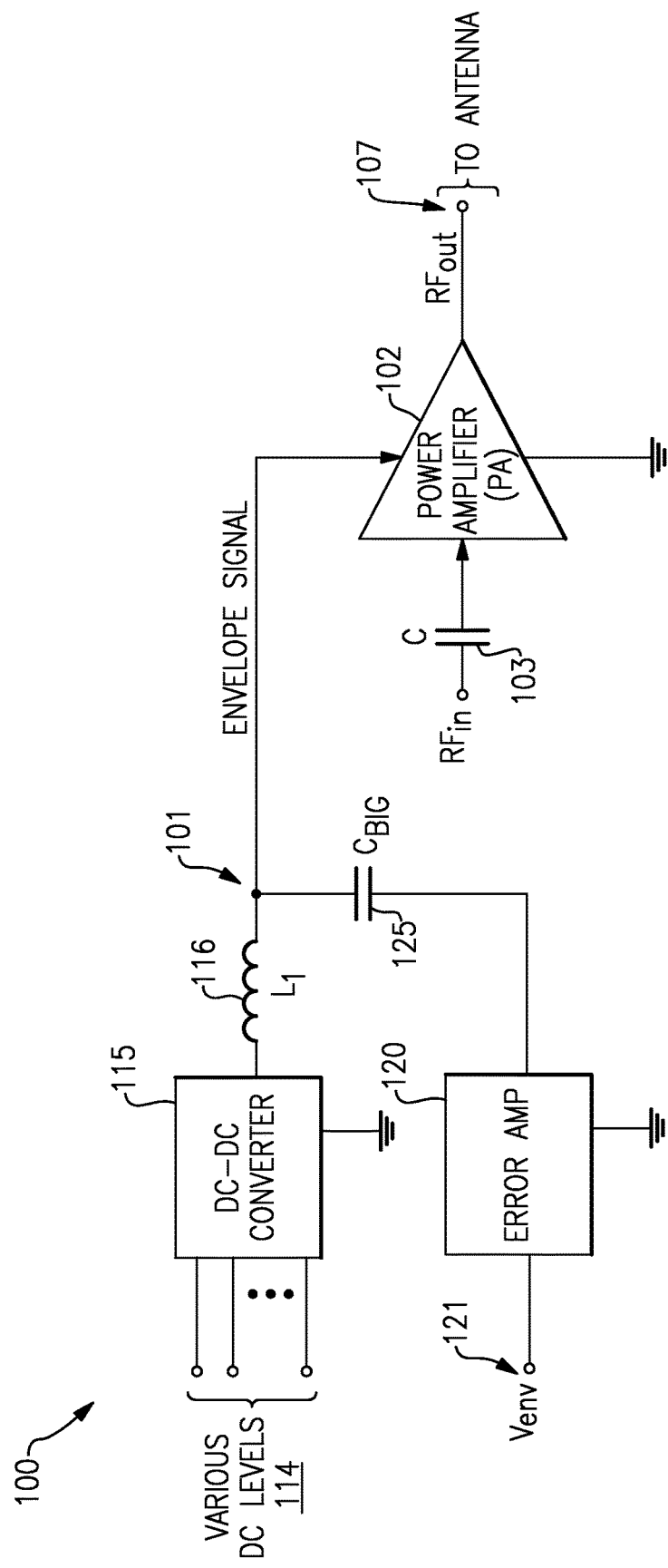
FIG. 1 is a schematic diagram of a power amplifier operating control configuration according to some implementations.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION OF SOME IMPLEMENTATIONS

The headings provided herein, if any, are for convenience only and do not necessarily affect the scope or meaning of the claimed invention.

Power amplifiers are used in communication networks to set the transmission level of data signals. For example, power amplifiers are used to set transmission pulse laser energy in optical communication networks. Power amplifiers are used in radio frequency (RF) components of wireless devices—e.g., base stations and mobile devices—to set the power level transmitted through an antenna. Power amplifiers are also used in local area networks to support connectivity of servers, computers, laptops, and peripheral devices.

Managing power amplifier (PA) operation is a concern in mobile devices because the efficiency of a PA often significantly affects the battery life of a mobile device. Envelope tracking can be used to improve PA efficiency, and includes adjusting the voltage supplied to a PA in association with the envelope of the RF signal amplified by the PA. That is, the PA voltage supply is increased in response to increases in the voltage envelope of the RF signal, and the PA voltage supply is decreased in response to decreases of the envelope. In some implementations, envelope tracking improves PA efficiency by reducing the bias voltage to the PA during a signal trough. In particular, in some implementations envelope tracking is effective for systems that are used to amplify signals with large peak-to-average ratios.

FIG. 1 is a schematic diagram of an example PA operating configuration 100 incorporating envelope tracking. While pertinent features are illustrated, those skilled in the art will appreciate that various other features have not been illustrated for the sake of brevity and so as not to obscure more pertinent aspects of the disclosed example. To that end, as a non-limiting example, the PA operating configuration 100 includes a PA 102, a DC-DC converter 115, and an error amplifier 120.

The PA 102 is arranged to receive a RF input signal ($RF_{in}$) through coupling capacitor 103 (C), and to provide an amplified RF output signal ($RF_{out}$) on output node 107. In various implementations, the capacitor 103 is implemented as a single capacitor or a multi-component capacitive circuit arrangement.

The PA 102 also has a voltage supply node 101 provided to receive a voltage supply level that tracks the voltage envelope (i.e., the envelope signal, $V_{env}$) of the RF input signal ($RF_{in}$). To that end, the voltage supply node 101 is coupled to the combination of the DC-DC converter 115 and the error amplifier 120. The DC-DC converter 115 is coupled to the voltage supply node 101 through series inductor 116 ($L_1$). The DC-DC converter 115 is provided to supply a DC voltage level to the PA 102 that coarsely tracks the envelope signal ($V_{env}$). In some implementations, the DC-DC converter 115 coarsely tracks the envelope signal ($V_{env}$) by switching between DC voltage levels supplied to the inputs 114 of the DC-DC converter 115.

Figure 2:
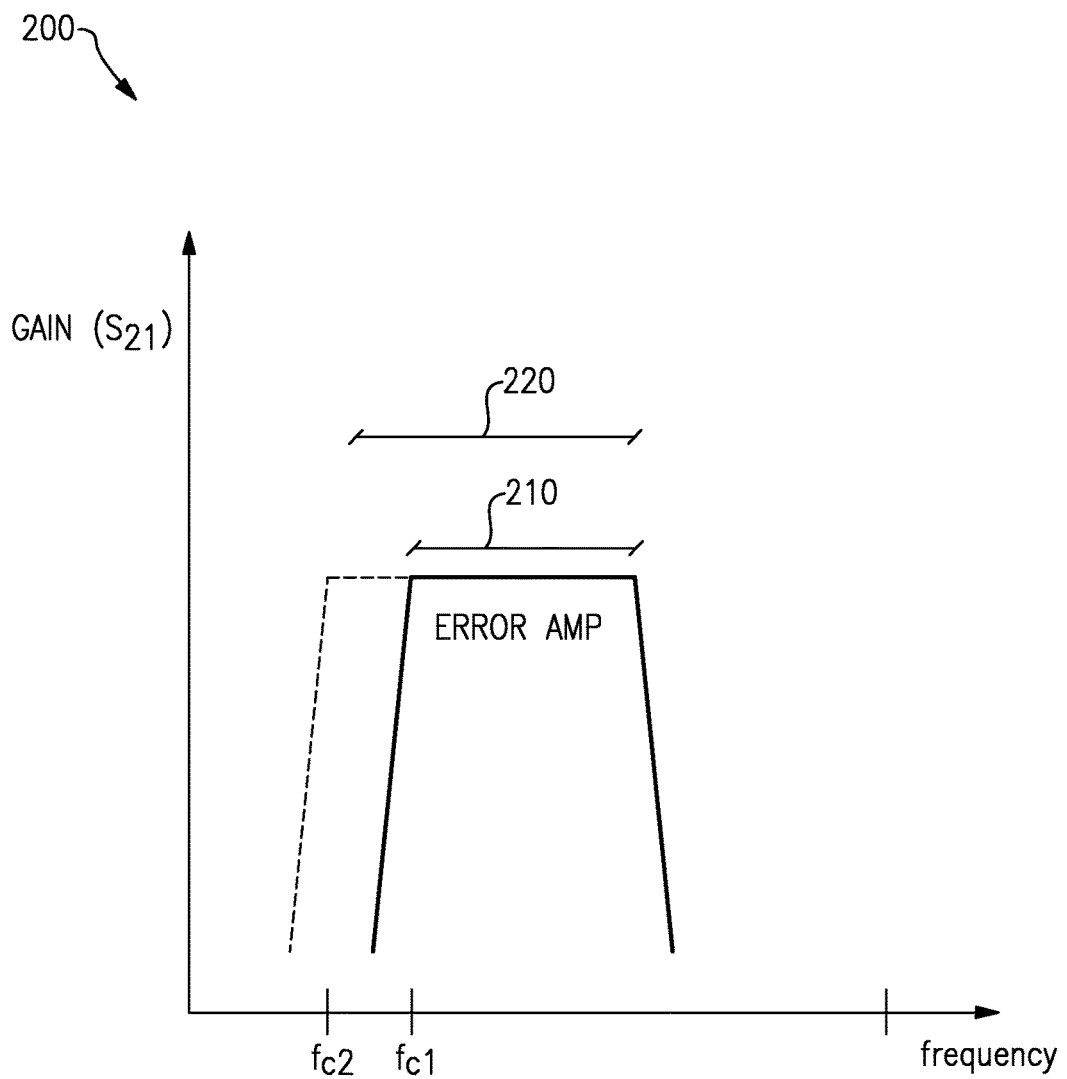
FIG. 2 is a performance diagram illustrating the frequency band within which an envelope signal passes to the power amplifier shown in FIG. 1.

The error amplifier 120 is provided to supply the substantially AC voltage envelope signal ($V_{env}$) to the voltage supply node 101 of the PA 102. A capacitor 125 ($C_{BIG}$) is used to couple the envelope signal ($V_{env}$) to the voltage supply node 101. With reference to FIG. 2, a drawback associated with this arrangement is that lower frequency components of the envelope signal ($V_{env}$) are blocked by the coupling capacitor 125 ($C_{BIG}$) due to the finite value of capacitance. FIG. 2 is a performance diagram 200 illustrating a pass band 210 within which portions of the envelope signal ($V_{env}$) are applied to the supply of the PA 102 shown in FIG. 1. The envelope signal ($V_{env}$) provided by the error amplifier 120 has a bandwidth 220 with a lower cutoff frequency $f_{c2}$. However, the capacitor 125 ($C_{BIG}$) creates the pass band 210, having a lower cutoff frequency $f_{c1}$, that substantially blocks lower frequency components of the envelope signal ($V_{env}$) below the lower cutoff frequency $f_{c1}$. In other words, the capacitor 125 ($C_{BIG}$) substantially creates a pass band filter with the pass band 210 that is smaller than bandwidth 220 of the envelope signal ($V_{env}$). Consequently, at least one of efficiency and linearity of the PA 102 may not benefit to the extent possible because the lower frequency components are substantially blocked by the coupling capacitor 125 ($C_{BIG}$).

Figure 3:
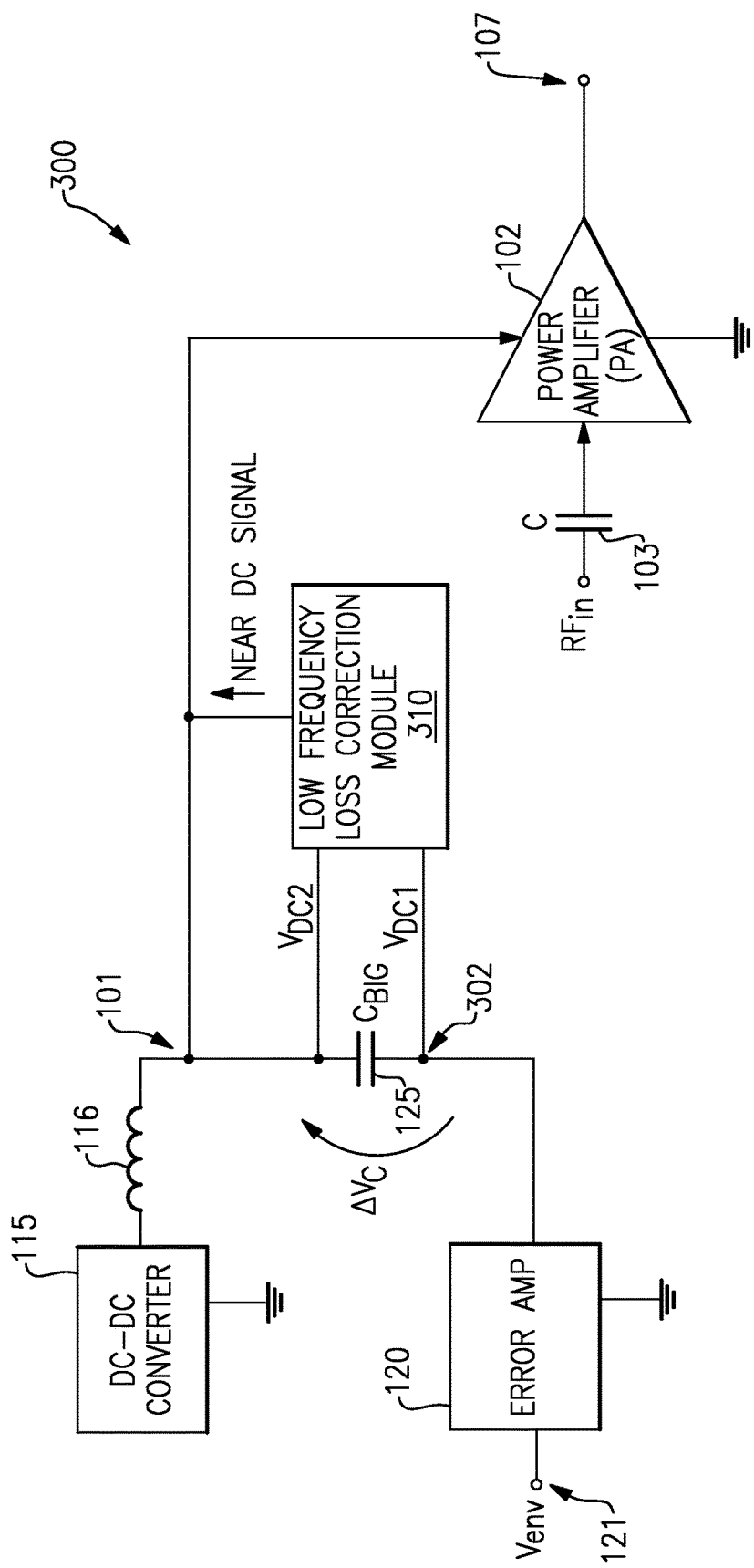
FIG. 3 is a schematic diagram of a power amplifier operating control configuration having low frequency loss correction according to some implementations.

By contrast, the various implementations described herein include systems, methods and devices configured to enable more desirable power amplifier operation at lower frequencies by correcting for low frequency envelope signal losses. To that end, FIG. 3 is a schematic diagram of a PA operating configuration 300 that incorporates low frequency envelope tracking according to some implementations. The PA operating configuration 300 illustrated in FIG. 3 is similar to and adapted from the PA operating configuration 100 illustrated in FIG. 1. Elements common to each include common reference numbers, and only the differences between FIGS. 1 and 3 are described herein for the sake of brevity. In particular, the PA operating configuration 300 includes a low frequency loss correction module 310. Briefly, the low frequency loss correction module 310 is configured to detect a low frequency portion of the envelope signal ($V_{env}$) that is substantially attenuated or lost through the coupling capacitor 125 ($C_{BIG}$), and to responsively provide a low frequency correction signal to the voltage supply node 101.

More specifically, the low frequency loss correction module 310 is configured to sense low frequency voltage component drop across the coupling capacitor 125 ($C_{BIG}$), which is used as an error signal. In some implementations, the low frequency loss correction module 310 includes a signal error detection circuit that is configured to detect one or more frequency components of an envelope signal below a cutoff frequency that are substantially attenuated through a capacitive path. In some implementations, the signal error detection circuit includes a comparator configured to produce an error signal as a function of respective first and second voltage signals sensed across the capacitive path (e.g., the coupling capacitor 125, $C_{BIG}$). The error signal is used to generate a low frequency correction signal that is supplied to the voltage supply node 101 of the PA 102. In some implementations, the low frequency loss correction module 310 includes a drive circuit configured to convert the error signal into a low frequency loss correction signal and to provide the low frequency loss correction signal to a voltage supply line of a power amplifier. In this manner the PA 102 is able to benefit from envelope tracking at lower frequencies, because previously attenuated or lost lower frequency envelope signal ($V_{env}$) components are now provided to the voltage supply node 101. In some implementations, PA efficiency benefits from envelope tracking at near DC frequencies using a low frequency loss correction module.

Figure 4:
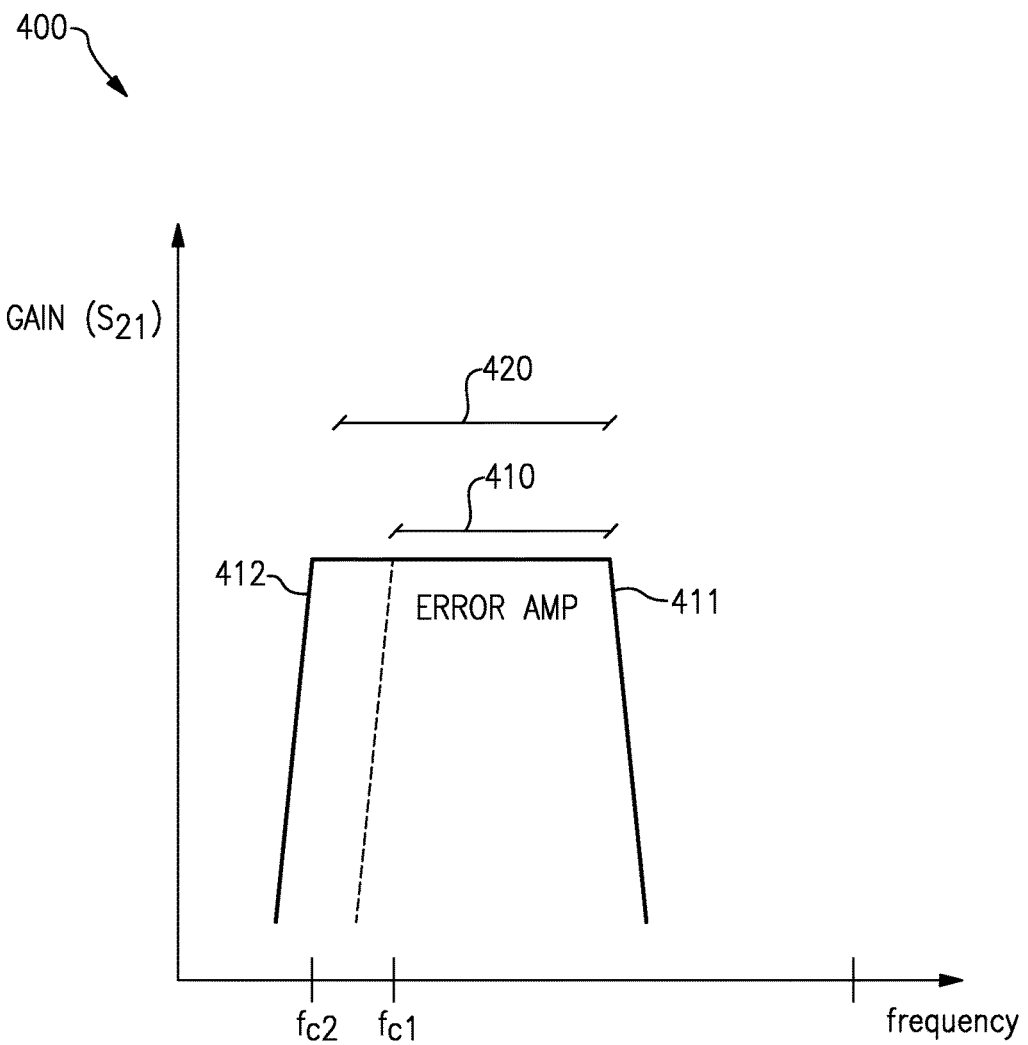
FIG. 4 is a performance diagram illustrating the frequency band within which an envelope signal passes to the power amplifier shown in FIG. 2.

FIG. 4 is a performance diagram 400 illustrating the frequency band within which the envelope signal ($V_{env}$) passes to the PA 102 shown in FIG. 3. As described above, the envelope signal ($V_{env}$) provided by the error amplifier 120 has a bandwidth 420 with a lower cutoff frequency $f_{c2}$. The capacitor 125 ($C_{BIG}$) substantially blocks lower frequency components of the envelope signal ($V_{env}$), and substantially passes frequency components that are above a lower cutoff frequency $f_{c1}$ to the voltage supply node 101 of the PA 102. In other words, the capacitor 125 ($C_{BIG}$) substantially limits the bandwidth of passable frequencies. However, the operation of the low frequency loss correction module 310 extends the lower range of frequency components of the envelope signal ($V_{env}$) to at least the lower cutoff frequency $f_{c2}$, enabling PA efficiency and/or linearity to benefit from envelope tracking at frequencies below the lower cutoff frequency $f_{c1}$ established by the coupling capacitor 125 ($C_{BIG}$).

Figure 5:
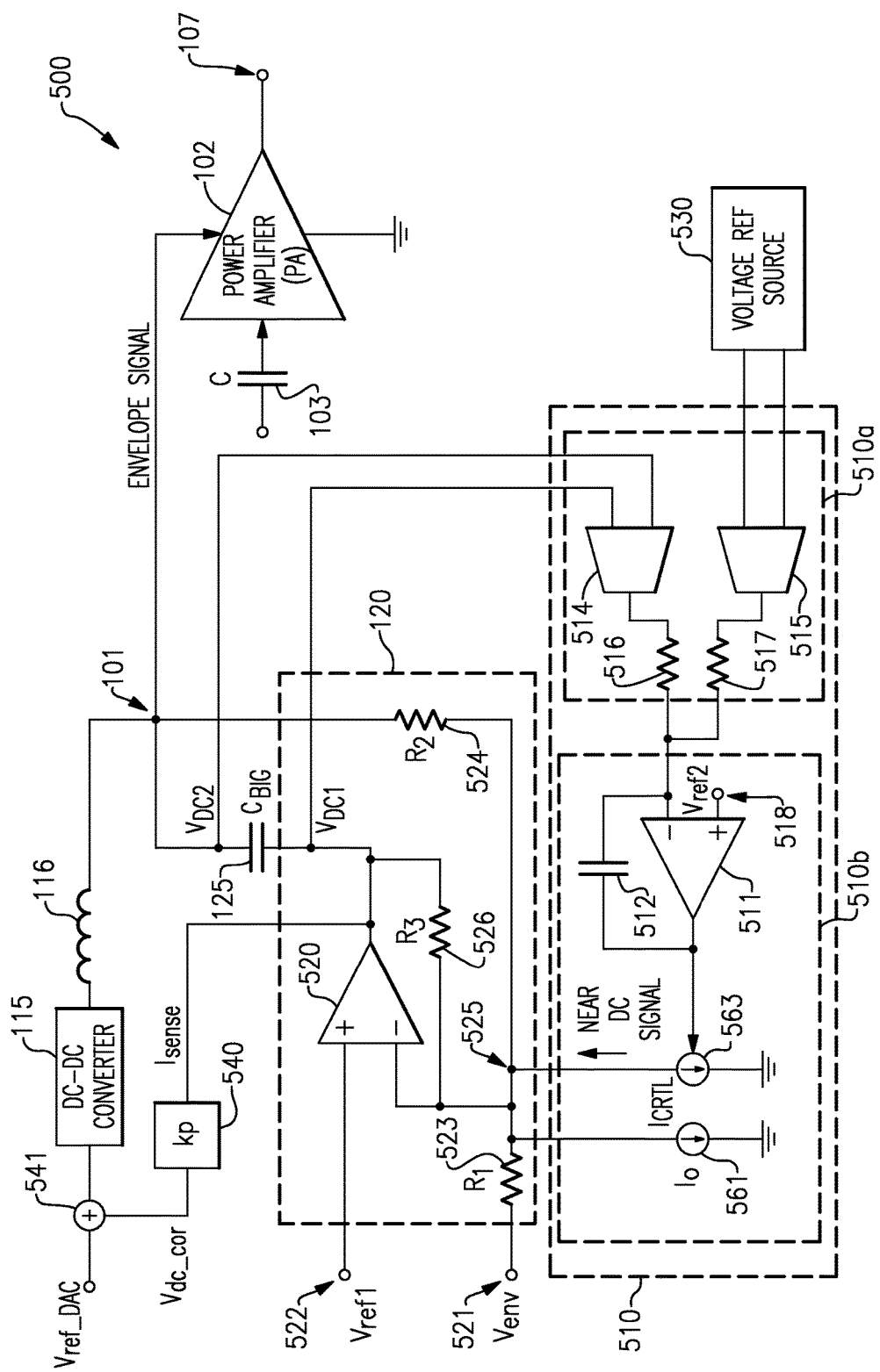
FIG. 5 is a schematic diagram of a power amplifier operating control configuration having low frequency loss correction according to some implementations.

FIG. 5 is a schematic diagram of a PA operating configuration 500 that includes low frequency envelope tracking in accordance with some implementations. The PA operating configuration 500 is similar to and adapted from the PA operating configuration 300 illustrated in FIG. 3. Elements common to each include common reference numbers, and only the differences between FIGS. 3 and 5 are described herein for the sake of brevity.

The error amplifier 120 shown in FIG. 5 includes a differential amplifier 520 (e.g., an op-amp), a voltage divider including first and second resistors 523, 524, and a third resistor 526. The first, second and third resistors 523, 524, 526 set the feedback gain of the error amplifier 520. The first and second resistors 523, 524 are coupled in series between the voltage supply node 101 and a first input node 521. The third resistor 526 is coupled between the output node and the negative input node of the differential amplifier 520. The first input node 521 is provided to receive the envelope signal ($V_{env}$) associated with the RF input signal ($RF_{in}$) amplified by the PA 102. The node 525 coupling the first and second resistors 523, 524 is also coupled to the negative input node of the differential amplifier 520. A second input node 522 is coupled to the positive input node of the differential amplifier 520, and is provided to receive a first reference signal ($V_{ref1}$). The output of the differential amplifier 520 is coupled to the AC coupling capacitor 125 ($C_{BIG}$). The output of the differential amplifier 520 is also coupled to provide a current, $I_{sense}$, to the hysteretic comparator 540.

The PA operating configuration 500 includes an implementation of a low frequency loss correction module 510 arranged in a manner similar to the low frequency loss correction module 310 of FIG. 3. The low frequency loss correction module 510 includes a signal error detection circuit 510a and a drive circuit 510b. The signal error detection circuit 510a is configured to detect one or more frequency components of an envelope signal below a cutoff frequency that are substantially attenuated through a capacitive path. To that end, the signal error detection circuit 510a includes a comparator 514 that is configured to produce an error signal as a function of respective first and second voltage signals sensed across the coupling capacitor 125 ($C_{BIG}$). The error signal is provided to the drive circuit 510b through resistor 516. Similarly, a reference signal is provided to the drive circuit 510b through resistor 517. In some implementations, as shown in FIG. 5, the reference signal is provided by a combination of a voltage source 530 and a comparator 515.

The drive circuit 510b includes a differential amplifier 511, a nominal current source ($I_o$) 561 and a controllable current source ($I_{CTRL}$) 563. The nominal current source ($I_o$) 561 and the controllable current source ($I_{CTRL}$) 563 are coupled in parallel between node 525 and ground. The negative input of the differential amplifier 511 is coupled to receive the respective error signal through the corresponding resistors 516, 517. The negative input of the differential amplifier 511 is coupled to receive a second reference signal ($V_{ref2}$). A capacitor 512 is coupled across the negative input and output of the differential amplifier 511. The output of the differential amplifier 511 is used to control the controllable current source ($I_{CTRL}$) 563, which serves as an output of the low frequency loss correction module 510.

In operation, the comparator 514 produces an error signal as a function of respective first and second voltage signals sensed across the coupling capacitor 125 ($C_{BIG}$). The differential amplifier 511 is used to generate a low frequency correction signal using the error signal and the reference signal. The low frequency correction signal is supplied to the voltage supply node 101 of the PA 102 through the controllable current source ($I_{CTRL}$) 563 and the voltage divider included in the error amplifier 120. In this manner the PA 102 is able to benefit from envelope tracking at lower frequencies, because the lower frequency envelope signal ($V_{env}$) components that are attenuated or lost through the coupling capacitor 125 ($C_{BIG}$) are now provided to the voltage supply node 101 by the low frequency loss correction module 510. In some implementations, PA efficiency benefits from envelope tracking at near DC frequencies using a low frequency loss correction module.

Figure 6:
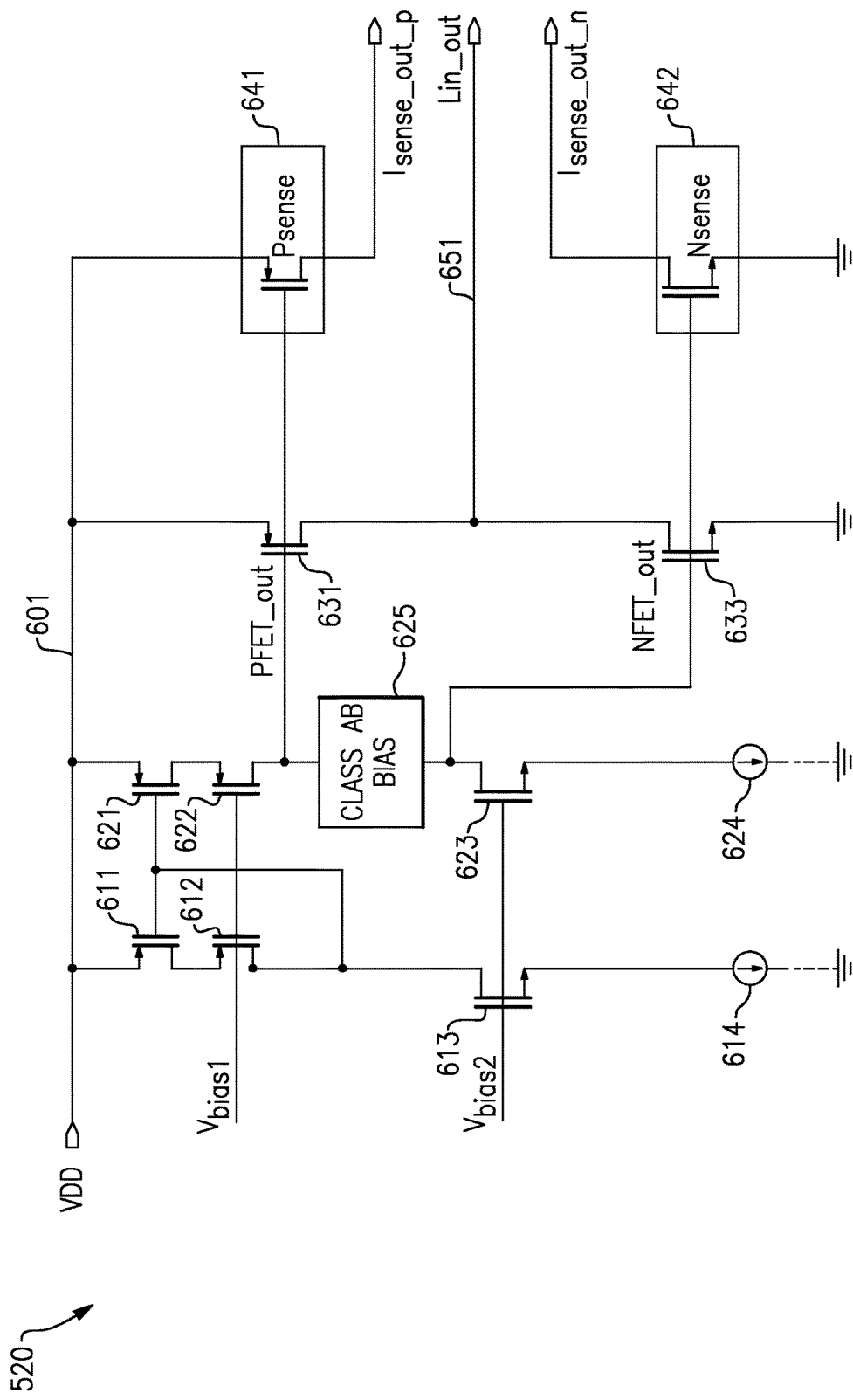
FIG. 6 is a schematic diagram of a component of the low frequency loss correction circuit of FIG. 5.

FIG. 6 is a schematic drawing of an implementation of the differential amplifier 520 of FIG. 5. The differential amplifier 520 includes first and second PMOS transistors 611, 612 coupled drain-to-source between a voltage supply (VDD) 601 and the drain of a first NMOS transistor 613. The source of the first NMOS transistor 613 is coupled to a first current source 614, which is ultimately coupled to ground. Similarly, the differential amplifier 520 also includes third and fourth PMOS transistors 621, 622 coupled drain-to-source between a voltage supply (VDD) 601 and a class AB bias circuit 625. The class AB bias circuit 625 is also coupled to the drain of a second NMOS transistor 623. The source of the second NMOS transistor 623 is coupled to a second current source 624, which is ultimately coupled to ground. The drain of the first NMOS transistor 613 is coupled to the gates of the first and third PMOS transistors 611, 621. The gates of the second and fourth PMOS transistors 612, 622 are coupled to an input bias voltage $V_{bias1}$. The gates of the first and second NMOS transistors 613, 623 are coupled to an input bias voltage $V_{bias2}$.

The differential amplifier 520 also includes an output PMOS transistor 631 and an output NMOS transistor 633, which are coupled drain-to-drain between the voltage supply (VDD) 601 and ground. The gate of the output PMOS transistor 631 is coupled to the drain of the fourth PMOS transistor 622. The gate of the output NMOS transistor 633 is coupled to the drain of the second NMOS transistor 623. The primary output node 651 of the differential amplifier is taken from the drains of the output PMOS transistor 631 and the output NMOS transistor 633.

Additionally, the differential amplifier 520 also has a current sense PMOS transistor 641, and a current sense NMOS transistor 642. The source of the current sense PMOS transistor 641 is coupled to the voltage supply (VDD) 601, and the gate is coupled to the drain of the fourth PMOS transistor 622. A first current sense output is taken from the drain of the current sense PMOS transistor 641. Similarly, the source of the current sense NMOS transistor 642 is coupled to ground, and the gate is coupled to the drain of the second NMOS transistor 623. A second current sense output is taken from the drain of the current sense NMOS transistor 642.

Figure 7:
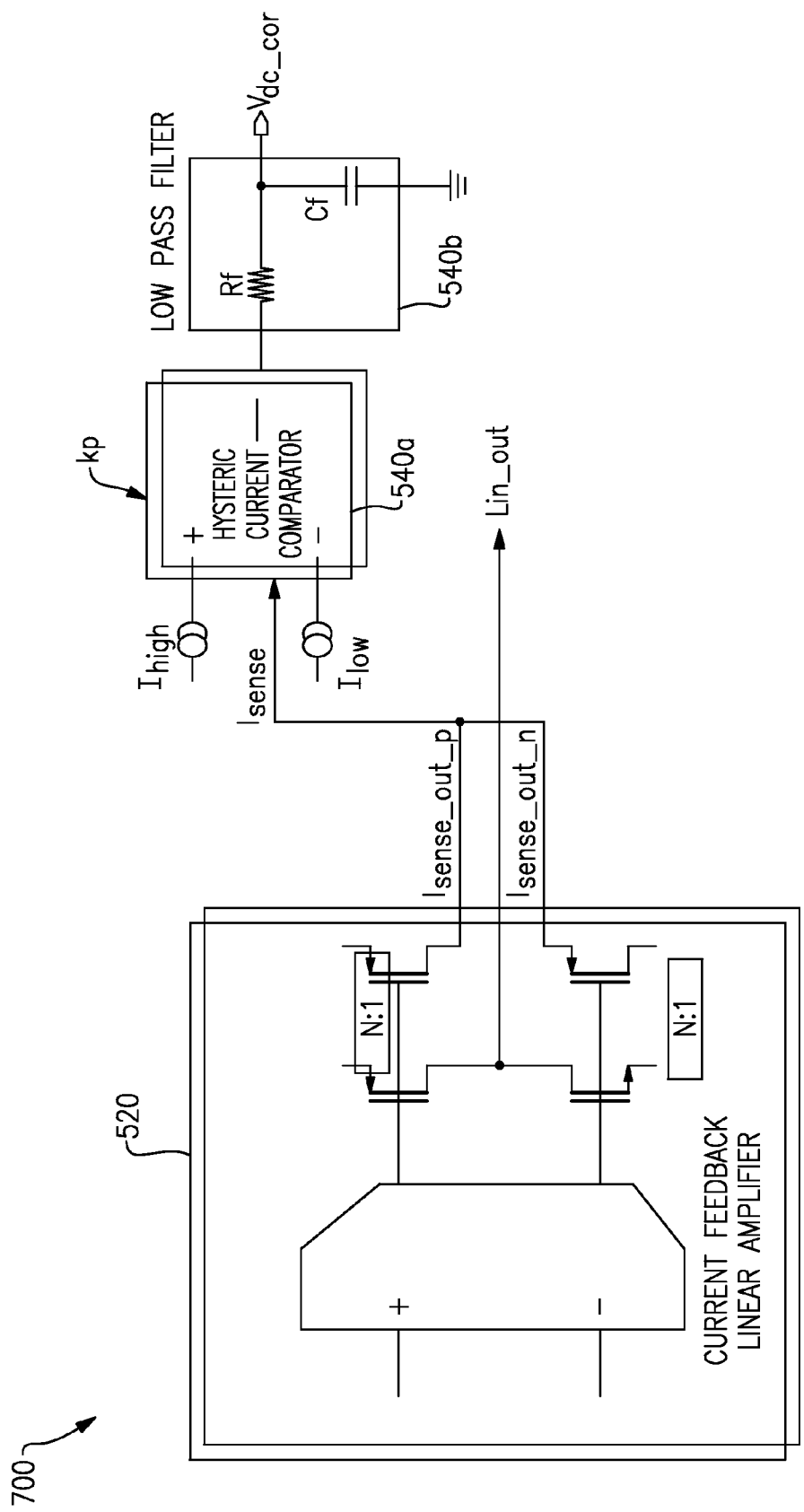
FIG. 7 is a schematic diagram of components of the low frequency loss correction circuit of FIG. 5.

FIG. 7 is a schematic diagram 700 of the differential amplifier 520 and hysteretic comparator 540 of FIG. 5. The hysteretic comparator 540 includes a current comparator 540a and a low pass filter 540b coupled in series. The current comparator 540a is coupled to receive the differential current !sense from the differential amplifier 520. In operation, the positive and negative currents flowing out of differential amplifier 520 are sensed by $I_{sense\_out\_p}$ and $I_{sense\_out\_n}$, and compared to determine the rise or fall of the average DC-DC voltage. In some implementations, a current comparator is utilized to perform the comparison. The output of the comparator 540a is then conditioned by the low pass filter 540b in order to obtain the voltage applied to correct the DC voltage provided by DC-DC converter 115. That is, the resulting signal is coupled back to the input of the DC to DC convertor thereby closing the feedback loop. In some implementations, in order to avoid oscillations the comparator 540a is a hysteretic comparator, having upper and lower limits $I_{high}$ and $I_{low}$. If the current difference (i.e., $I_{high}$-$I_{low}$) is high, less high frequency content is obtained. Thus, in combination with the low pass filter 540b a preferred filter characteristic is produced.

Figure 8:
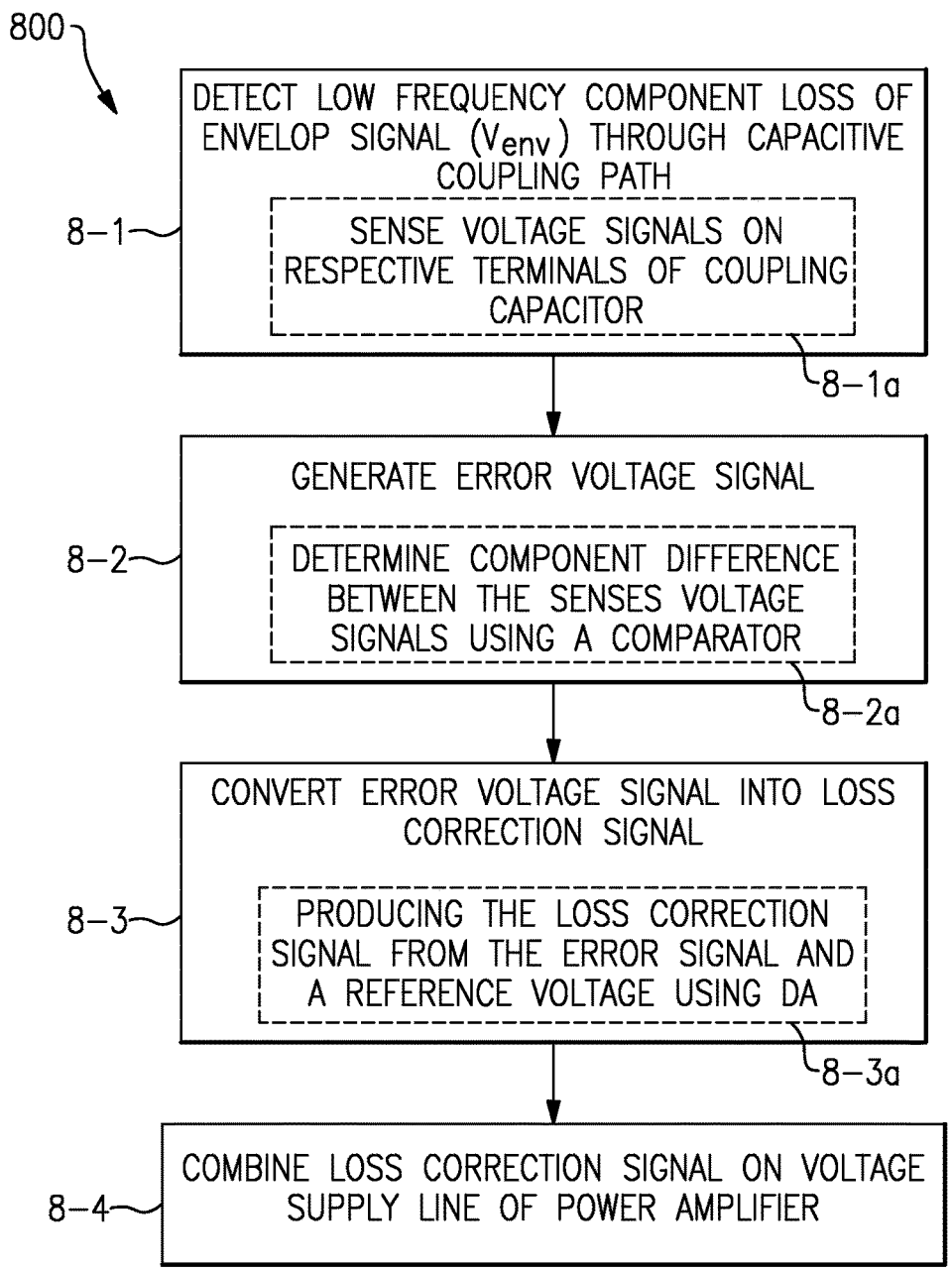
FIG. 8 is a flowchart of an implementation of a method of correction low frequency signal component loss in accordance with some implementations.

FIG. 8 is a flowchart of an implementation of a method 800 of correcting low frequency component loss associated with coupling an envelope signal to the voltage supply of a power amplifier through a capacitive path. In some implementations, method 800 is performed by a power management system and/or controller associated with a power amplifier. Briefly, method 800 includes detecting a low frequency portion of an envelope signal that is substantially attenuated or lost through a capacitive path, and responsively providing a low frequency correction signal to a voltage supply node of a power amplifier.

To that end, as represented by block 8-1, method 800 includes detecting low frequency component loss of an envelope signal through a capacitive path. For example, as represented by block 8-1a and with further reference to FIG. 5, the method 800 includes sensing voltage signals on respective terminals of the coupling capacitor ($C_{BIG}$). As represented by block 8-2, the method 800 includes generating an error signal that is representative of low frequency component loss. For example, as represented by block 8-2a and with further reference to FIG. 5, the method 800 includes determining the component difference between the voltage signals sensed across the coupling capacitor ($C_{BIG}$), in order to detect low frequency component loss, by using the comparator 514. As represented by block 8-3, the method 800 includes converting the error voltage signal into a loss correction signal. For example, as represented by block 8-3a and with further reference to FIG. 5, the method 800 includes producing the loss correction signal using the differential amplifier 511. As represented by block 8-4, the method 800 includes combining or adding the loss correction signal to the voltage supply line of the power amplifier.

FIGS. 9A-9C are schematic diagrams of different integrated circuit implementations of the low frequency loss correction module 510 of FIG. 5. While some example features are illustrated, those skilled in the art will appreciate from the present disclosure that various other features have not been illustrated for the sake of brevity and so as not to obscure more pertinent aspects of the example implementations disclosed herein. To that end, for example, FIG. 9A shows that in some implementations, some or all portions of the low frequency loss correction module 510 can be part of a semiconductor die 1000. By way of an example, the low frequency loss correction module 510 can be formed on a substrate 1002 of the die 1000. A plurality of connection pads 1004 can also be formed on the substrate 1002 to facilitate functionalities associated with some or all portions of the low frequency loss correction module 510.

FIG. 9B shows that in some implementations, a semiconductor die 1000 having a substrate 1002 can include some or all portions of the error amplifier 120 and some or all portions of the low frequency loss correction module 510 of FIG. 5. A plurality of connection pads 1004 can also be formed on the substrate 1002 to facilitate functionalities associated with some or all portions of the error amplifier 120 and some or all portions of the low frequency loss correction module 510 of FIG. 5.

FIG. 9C shows that in some implementations, a semiconductor die 1000 having a substrate 1002 can include some or all portions of the PA circuit 102, some or all portions of the error amplifier 120 and some or all portions of the low frequency loss correction module 510 of FIG. 5. A plurality of connection pads 1004 can also be formed on the substrate 1002 to facilitate functionalities associated with some or all portions of the PA circuit 102, the error amplifier 120, and the low frequency loss correction module 510.

In some implementations, one or more features described herein can be included in a module. FIG. 10 is a schematic diagram of an implementation of a module 1100 including the low frequency loss correction module 510 of FIG. 5. While some example features are illustrated, those skilled in the art will appreciate from the present disclosure that various other features have not been illustrated for the sake of brevity and so as not to obscure more pertinent aspects of the example implementations disclosed herein. The module 1100 includes a packaging substrate 1152, connection pads 1156, a CMOS (complementary metal oxide semiconductor) die 1000, a HBT (heterojunction bipolar transistor) die 1110, a matching network 108, and one or more surface mount devices 1160.

The CMOS die 1000 includes a substrate 1002 including some or all portions of the error amplifier 120 and some or all portions of the low frequency loss correction module 510 of FIG. 5. A plurality of connection pads 1004 is formed on the substrate 1002 to facilitate functionalities associated with some or all portions of the error amplifier 120 and some or all portions of the low frequency loss correction module 510 of FIG. 5. Similarly, the HBT die 1110 includes a substrate 1102 including some or all portions of the PA 102 and some or all portions of the bias circuitry provided to set the quiescent conditions of the PA 102. The HBT die 1110 also includes a plurality of connection pads 1104 formed on the substrate 1102 to facilitate functionalities associated with some or all portions of the PA 102 and some or all portions of the bias circuitry 1103.

The connection pads 1156 on the packaging substrate 1152 facilitate electrical connections to and from each of the CMOS die 1000 and the HBT die 1110. For example, the connection pads 1156 facilitate the use of wirebonds 1154 for passing various signals and supply currents and/or voltages to each of the CMOS die 1000 and the HBT die 1110.

In some implementations, the components mounted on the packaging substrate 1152 or formed on or in the packaging substrate 1152 can further include, for example, one or more surface mount devices (SMDs) (e.g., 1160) and one or more matching networks (e.g., 108). In some implementations, the packaging substrate 1152 can include a laminate substrate.

In some implementations, the module 1100 can also include one or more packaging structures to, for example, provide protection and facilitate easier handling of the module 1100. Such a packaging structure can include an overmold formed over the packaging substrate 1152 and dimensioned to substantially encapsulate the various circuits and components thereon.

It will be understood that although the module 1100 is described in the context of wirebond-based electrical connections, one or more features of the present disclosure can also be implemented in other packaging configurations, including flip-chip configurations.

In some implementations, a device and/or a circuit having one or more features described herein can be included in an RF device such as a wireless device. Such a device and/or a circuit can be implemented directly in the wireless device, in a modular form as described herein, or in some combination thereof. In some implementations, such a wireless device can include, for example, a cellular phone, a smartphone, a hand-held wireless device with or without phone functionality, a wireless tablet, a wireless router, a wireless access point, a wireless base station, etc. That is, those skilled in the art will also appreciate from the present disclosure that in various implementations the low frequency loss correction module may be included in various devices, such as a computer, a laptop computer, a tablet device, a netbook, an internet kiosk, a personal digital assistant, an optical modem, a base station, a repeater, a wireless router, a mobile phone, a smartphone, a gaming device, a computer server, or any other computing device. In various implementations, such devices include one or more processors, one or more types of memory, a display and/or other user interface components such as a keyboard, a touch screen display, a mouse, a track-pad, a digital camera and/or any number of supplemental devices to add functionality.

Figure 11:
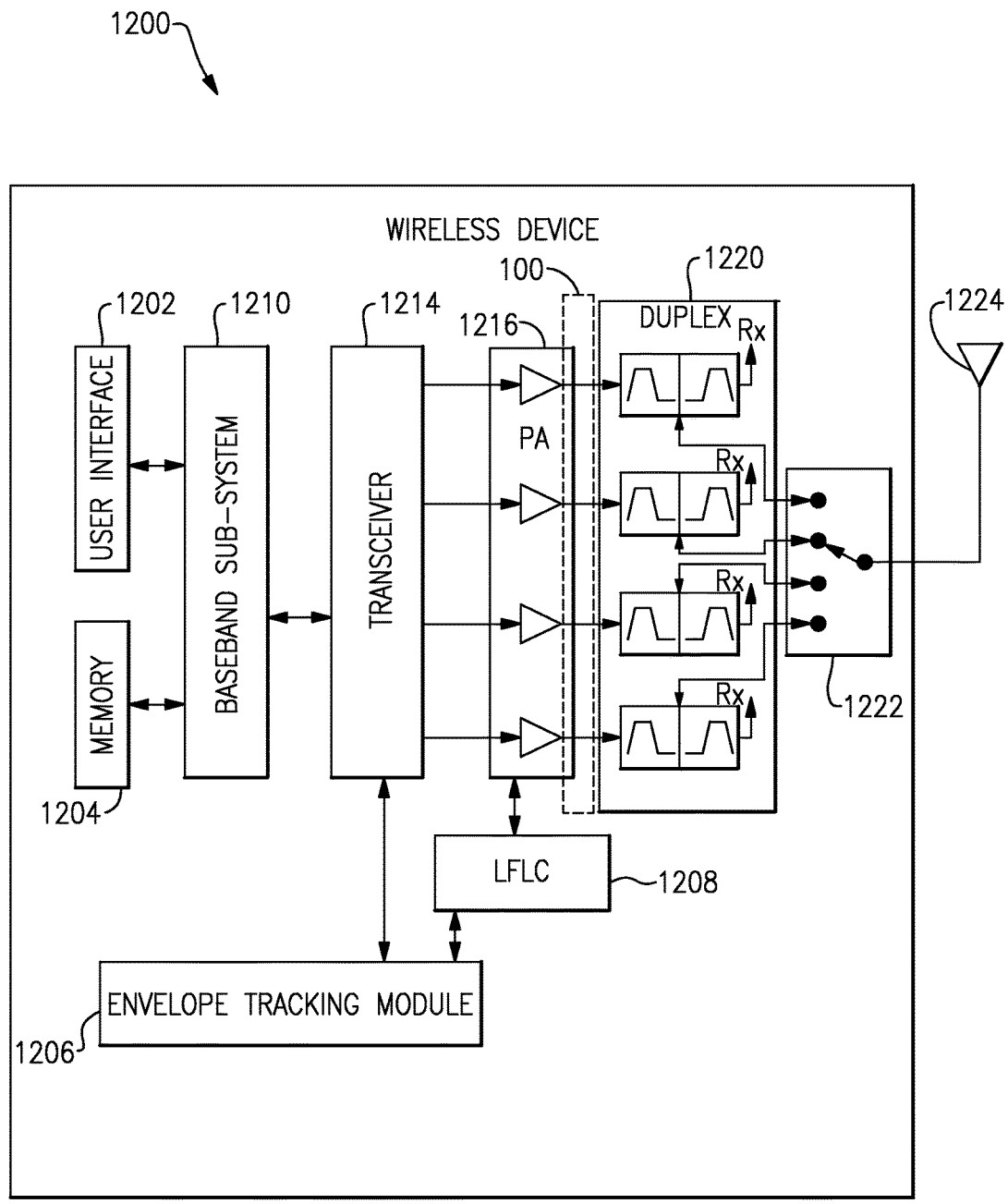
FIG. 11 is a schematic diagram of an implementation of a wireless device including the low frequency loss correction circuit of FIG. 5.

FIG. 11 is a schematic diagram of an implementation of a wireless device 1200 including one or more features described herein, such as the low frequency loss correction module 510 of FIG. 5. While some example features are illustrated, those skilled in the art will appreciate from the present disclosure that various other features have not been illustrated for the sake of brevity and so as not to obscure more pertinent aspects of the example implementations disclosed herein.

One or more PAs 1216 as described herein are biased by respective bias circuit(s) (not shown) and compensated by respective compensation circuit(s) (not shown). In some implementations the PAs 1216 are packaged into a module including matching circuits 100. The PAs 1216 can receive respective RF signals from a transceiver 1214, that can be configured and operated in known manners to generate RF signals to be amplified and transmitted, and to process received signals. The transceiver 1214 is shown to interact with a baseband sub-system 1210 that is configured to provide conversion between data and/or voice signals suitable for a user and RF signals suitable for the transceiver 1214. The transceiver 1214 is also shown to be connected to an envelope tracking module 1206 that is configured to manage power for the operation of the wireless device 1200. Such power management can also control operations of the baseband sub-system 1210, and the low frequency loss correction module 1208 coupled to the PAs 1216.

The baseband sub-system 1210 is shown to be connected to a user interface 1202 to facilitate various input and output of voice and/or data provided to and received from the user. The baseband sub-system 1210 can also be connected to a memory 1204 that is configured to store data and/or instructions to facilitate the operation of the wireless device, and/or to provide storage of information for the user.

In the example wireless device 1200, outputs of the PAs 1216 are shown to be matched and routed to an antenna 1224 via respective duplexers 1220 and a band-selection switch 1222. The band-selection switch 1222 can include, for example, a single-pole-multiple-throw (e.g., SP4T) switch to allow selection of an operating band (e.g., Band 2). In some implementations, each duplexer 1220 can allow transmit and receive operations to be performed simultaneously using a common antenna (e.g., 1224).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some implementations, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some implementations may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A low frequency loss correction circuit comprising:
   a signal error detection circuit connectable across a capacitance along a path for providing an envelope signal to an amplifier, and configured to produce an error signal in response to detecting a frequency component of the envelope signal below a cutoff frequency and attenuated by the capacitance; and
   a drive circuit configured to generate a low frequency correction signal based on the error signal, and provide the low frequency correction signal to a voltage supply line for the amplifier, such that the low frequency correction signal corrects for the attenuated frequency component of the envelope signal.

2. The low frequency loss correction circuit of claim 1 wherein the signal error detection circuit includes first and second detection nodes connectable across the capacitance to sense respective first and second signals.

3. The low frequency loss correction circuit of claim 2 wherein the signal error detection circuit further includes a comparator configured to produce the error signal as a function of the first and second signals.

4. The low frequency loss correction circuit of claim 1 wherein the drive circuit includes a controllable current source coupled to the voltage supply line.

5. The low frequency loss correction circuit of claim 4 wherein a terminal of the controllable current source is coupled to a portion of a voltage divider between the voltage supply line and a source of the envelope signal.

6. The low frequency loss correction circuit of claim 1 wherein the drive circuit includes a differential amplifier arranged to produce an output representative of the low frequency correction signal based on the error signal and a reference signal.

7. The low frequency loss correction circuit of claim 1 wherein the amplifier is a power amplifier configured to operate in an envelope tracking mode.

8. A power amplifier module comprising:
   a packaging substrate configured to receive a plurality of components;
   a power amplifier implemented on a die that is mounted on the packaging substrate, the power amplifier configured to operate with a supply voltage provided through a supply line;
   a signal error detection circuit connected across a capacitance along a path for providing an envelope signal to the power amplifier, and configured to produce an error signal in response to detecting a frequency component of the envelope signal below a cutoff frequency and attenuated by the capacitance; and
   a drive circuit configured to generate a low frequency correction signal based on the error signal, and provide the low frequency correction signal to the supply line, such that the low frequency correction signal corrects for the attenuated frequency component of the envelope signal.

9. The power amplifier module of claim 8 further comprising a tracking circuit configured to provide the envelope signal, the envelope signal characterizing a voltage envelope of a signal being amplified by the power amplifier.

10. The power amplifier module of claim 8 wherein the signal error detection circuit includes first and second detection nodes connected across the capacitance to sense respective first and second signals.

11. The power amplifier module of claim 10 wherein the signal error detection circuit further includes a comparator configured to produce the error signal as a function of the first and second signals.

12. The power amplifier module of claim 8 wherein the drive circuit includes a controllable current source coupled to the supply line.

13. The power amplifier module of claim 12 wherein a terminal of the controllable current source is coupled to a portion of a voltage divider between the supply line and a source of the envelope signal.

14. The power amplifier module of claim 8 wherein the drive circuit includes a differential amplifier arranged to produce an output representative of the low frequency correction signal based on the error signal and a reference signal.

15. A wireless device comprising:
a transceiver configured to generate a signal;
a power amplifier module configured to amplify the signal, and including a power amplifier configured to operate with a supply voltage provided through a supply line to amplify the signal, the power amplifier module further including a signal error detection circuit connected across a capacitance along a path for providing an envelope signal to the power amplifier, and configured to produce an error signal in response to detecting a frequency component of the envelope signal below a cutoff frequency and attenuated by the capacitance, the power amplifier module further including a drive circuit configured to generate a low frequency correction signal based on the error signal, and provide the low frequency correction signal to the supply line, such that the low frequency correction signal corrects for the attenuated frequency component of the envelope signal; and
an antenna in communication with the power amplifier module and configured to facilitate transmission of the amplified signal.

16. The wireless device of claim 15 further comprising a tracking circuit configured to provide the envelope signal, the envelope signal characterizing a voltage envelope of the signal being amplified by the power amplifier.

17. The wireless device of claim 15 wherein the signal error detection circuit includes first and second detection nodes connected across the capacitance to sense respective first and second signals.

18. The wireless device of claim 15 wherein the drive circuit includes a controllable current source coupled to the supply line.

19. The wireless device of claim 18 wherein a terminal of the controllable current source is coupled to a portion of a voltage divider between the supply line and a source of the envelope signal.

20. The wireless device of claim 15 wherein the drive circuit includes a differential amplifier arranged to produce an output representative of the low frequency correction signal based on the error signal and a reference signal.

* * * * *